(12) United States Patent
Martin et al.

(10) Patent No.: US 10,139,467 B2
(45) Date of Patent: Nov. 27, 2018

(54) ADJUSTMENT OF THE TABLE POSITION IN MR IMAGING

(71) Applicant: Siemens Aktiengesellschaft, Munich (DE)

(72) Inventors: Diana Martin, Herzogenaurach (DE); Joerg Roland, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 676 days.

(21) Appl. No.: 14/741,992

(22) Filed: Jun. 17, 2015

(65) Prior Publication Data
US 2015/0362567 A1 Dec. 17, 2015

(30) Foreign Application Priority Data
Jun. 17, 2014 (DE) .................. 10 2014 211 574

(51) Int. Cl.
*G01R 33/58* (2006.01)
*G01R 33/28* (2006.01)
*G01R 33/483* (2006.01)
*G01R 33/54* (2006.01)
*G01R 33/56* (2006.01)
*G01R 33/48* (2006.01)
*G01R 33/561* (2006.01)
*G01R 33/563* (2006.01)

(52) U.S. Cl.
CPC ......... *G01R 33/583* (2013.01); *G01R 33/288* (2013.01); *G01R 33/4828* (2013.01); *G01R 33/4835* (2013.01); *G01R 33/543* (2013.01); *G01R 33/5608* (2013.01); *G01R 33/5611* (2013.01); *G01R 33/56383* (2013.01)

(58) Field of Classification Search
CPC .............. G01R 33/4835; G01R 33/543; G01R 33/5611; G01R 33/4828; G01R 33/5608; G01R 33/583; G01R 33/56383; G01R 33/288
USPC ........................................................ 324/309
See application file for complete search history.

(56) References Cited

U.S. PATENT DOCUMENTS

| | | | | |
|---|---|---|---|---|
| 6,759,847 B2 * | 7/2004 | Brinker | ................ | A61B 5/0555 324/307 |
| 7,030,615 B2 * | 4/2006 | Gortler | .................. | A61B 5/055 324/318 |
| 7,145,338 B2 | 12/2006 | Campagna et al. | | |
| 7,622,921 B2 * | 11/2009 | Fontius | .............. | G01R 33/5612 324/307 |
| 8,536,868 B2 * | 9/2013 | Zenge | .............. | G01R 33/56375 324/307 |
| 8,941,380 B2 * | 1/2015 | Graesslin | ............. | G01R 33/583 324/307 |
| 9,013,183 B2 | 4/2015 | Yamanaka | | |

(Continued)

*Primary Examiner* — Christopher McAndrew
(74) *Attorney, Agent, or Firm* — Schiff Hardin LLP

(57) ABSTRACT

A method computer and magnetic resonance (MR) apparatus for controlling a table position of an examination table of the MR apparatus during an MR measurement. An SAR load is determined for an examination object with a calculated pulse sequence, at least for a first table position. Then the table position is adjusted while taking into consideration the SAR load at the first table position. The adjustment of the table position ensures that the SAR load of the examination object is reduced.

11 Claims, 3 Drawing Sheets

(56) References Cited

U.S. PATENT DOCUMENTS

| | | | |
|---|---|---|---|
| 2003/0080738 A1* | 5/2003 | Brinker | G01R 33/583 324/309 |
| 2006/0064002 A1* | 3/2006 | Grist | A61B 5/015 600/410 |
| 2006/0197528 A1* | 9/2006 | Bielmeier | G01R 33/28 324/314 |
| 2007/0096735 A1* | 5/2007 | Morich | G01R 33/28 324/318 |
| 2008/0218166 A1* | 9/2008 | Arnold | A61B 5/0555 324/307 |
| 2009/0177076 A1 | 7/2009 | Aldefeld et al. | |
| 2010/0191098 A1* | 7/2010 | Ladd | A61B 5/7257 600/420 |
| 2011/0043205 A1* | 2/2011 | Graesslin | G01R 33/5612 324/307 |
| 2013/0002249 A1* | 1/2013 | Wald | G01R 33/288 324/309 |
| 2014/0300355 A1* | 10/2014 | Fautz | G01R 33/28 324/309 |
| 2014/0378823 A1* | 12/2014 | Brinker | A61B 5/0555 600/415 |

\* cited by examiner

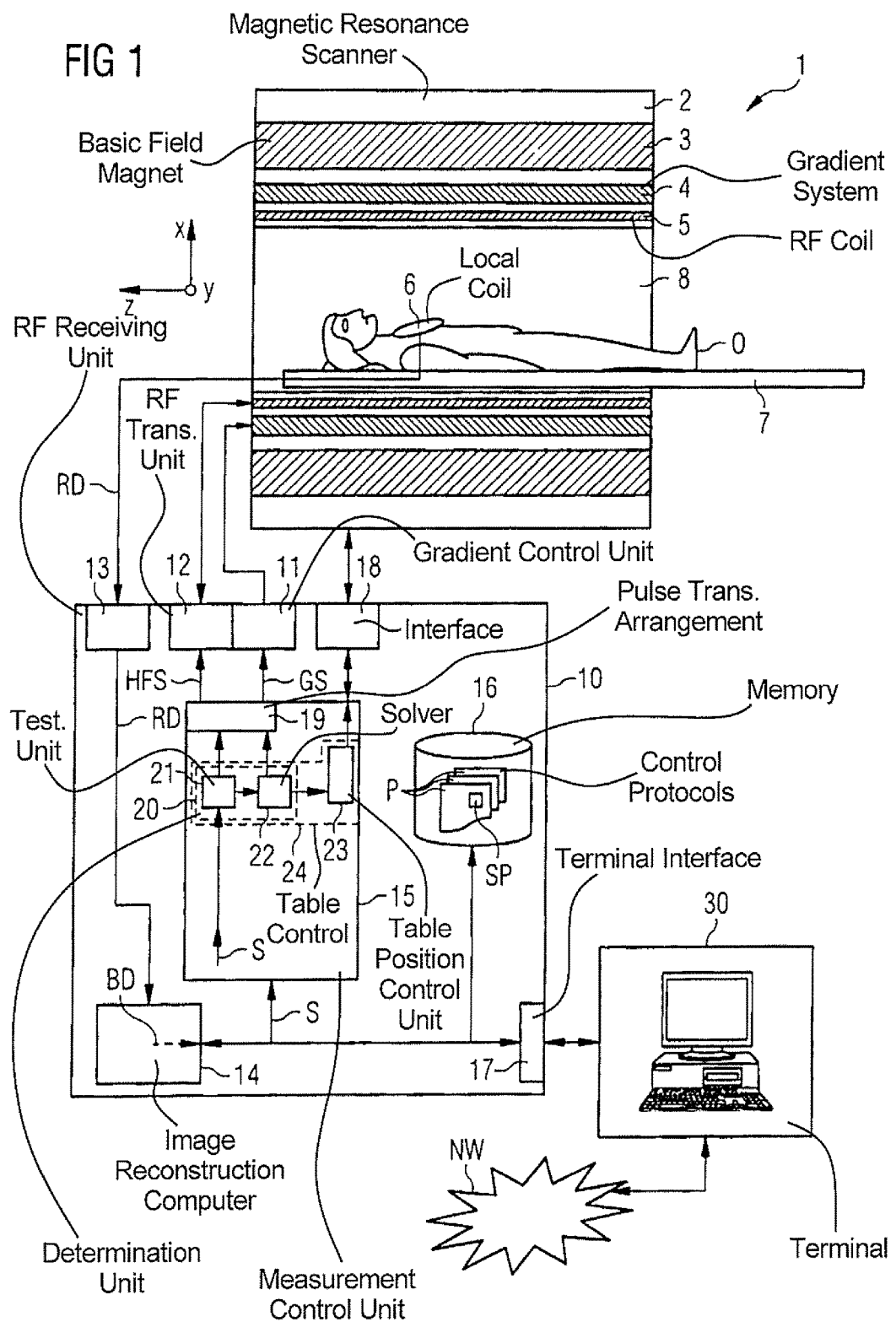

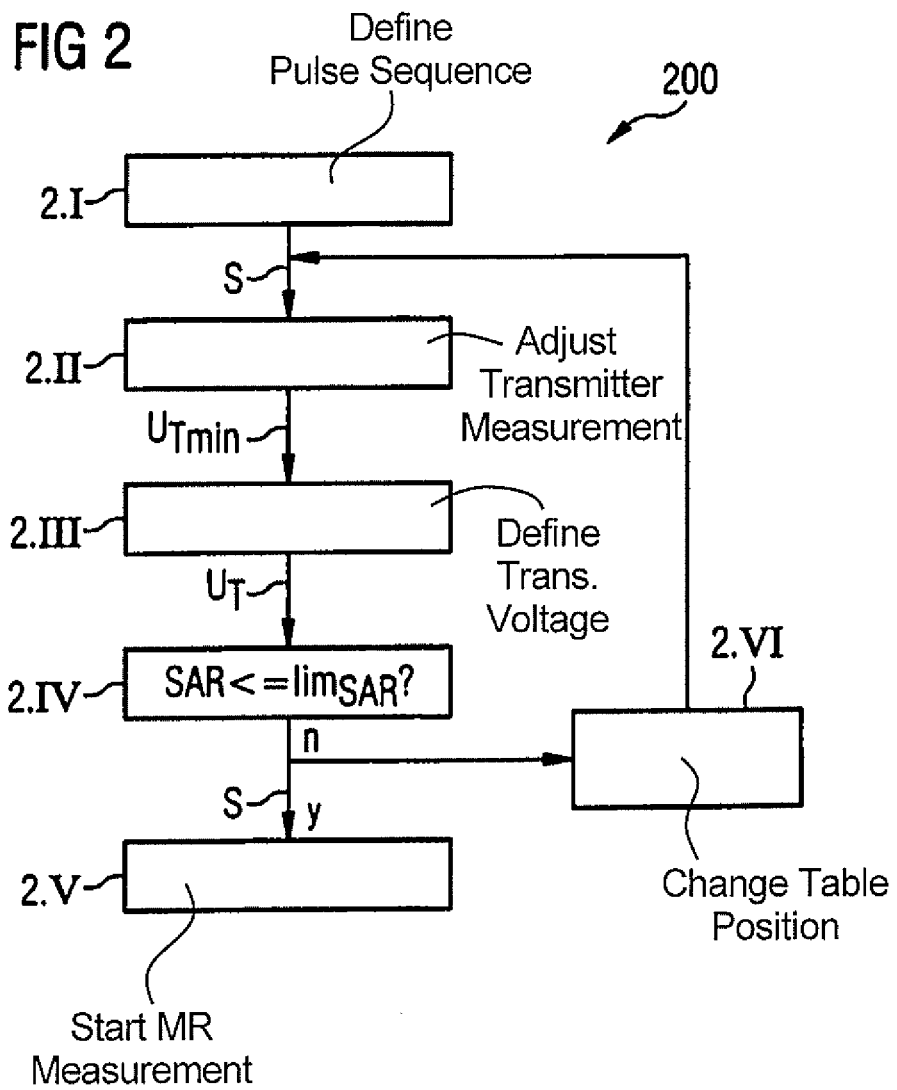

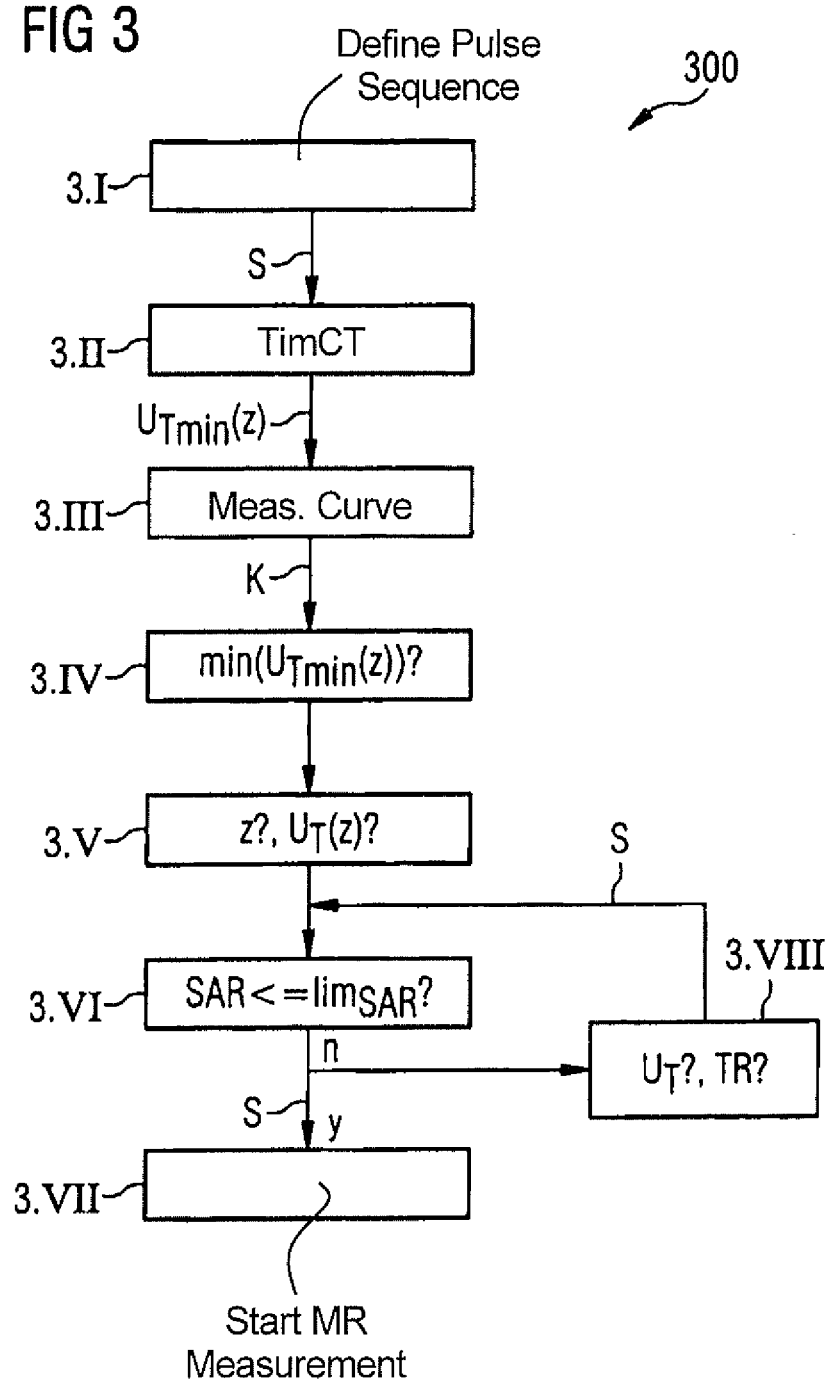

ADJUSTMENT OF THE TABLE POSITION IN MR IMAGING

BACKGROUND OF THE INVENTION

Field of the Invention

The invention concerns a method for controlling a table position of an examination table of a magnetic resonance system during a magnetic resonance measurement (data acquisition). Furthermore the invention concerns a device for controlling a table position of an examination table of a magnetic resonance system during a magnetic resonance measurement. The invention further relates to such a magnetic resonance system.

Description of the Prior Art

In a magnetic resonance system, the body to be examined is normally exposed to a relatively high basic magnetic field, for example of 3 or 7 tesla, with the use of a basic field magnet. In addition a magnetic field gradient is created with the use of a gradient system. Using a radio-frequency transmission system, radio-frequency excitation signals (RF signals) are then transmitted by suitable antennas, which results in the nuclear spins of particular atoms being resonantly excited by this radio-frequency field, so as to be tilted in a spatially resolved manner by a defined flip angle compared to the magnetic field lines of the basic magnetic field. This radio-frequency excitation or the resulting flip angle distribution is also referred to below as nuclear magnetization or "magnetization" for short. When the nuclear spins relax, radio-frequency signals known as magnetic resonance signals are emitted and are received by suitable receiving antennas, and then further processed. From the raw data acquired in this way, the desired image data can ultimately be reconstructed. The transmission of the radio-frequency signals for nuclear spin magnetization takes place, for example, by a so-called "whole-body coil" or "body coil", or often using local coils positioned on the patient or test person.

The radio-frequency signals result in an overall radio-frequency load on the patient, which has to be restricted in accordance with legal requirements, because an excessive radio-frequency load could result in injury to the patient. Hence the radio-frequency load on the patient is generally calculated in advance while planning the radio-frequency pulses to be emitted and the radio-frequency pulses are selected such that a particular limit is not reached. In the following the RF load means a physiological load induced by the RF radiation and not the introduced RF energy as such. A typical measure for the radio-frequency load is the SAR value (SAR=Specific Absorption Rate), which indicates in watts/kg the biological load that is being applied to the patient by a particular radio-frequency pulse output. In other words, the SAR value describes the energy absorption behavior of the tissue, which results in warming of the tissue that is exposed to the radio-frequency pulses. For the overall SAR or RF load of a patient, a standardized limit of 4 watts/kg, for example, applies in the "first level" in accordance with the IEC standard. In addition, apart from the advance planning, the SAR load of the patient is continuously monitored during the examination using suitable safety devices in the magnetic resonance system and the data acquisition is changed or aborted if the SAR value goes above the permitted standards. Nevertheless, it makes sense for advance planning to be as accurate as possible in order to avoid aborting a measurement, since this would necessitate a new measurement.

For planning the RF pulse sequence, the user specifies a target magnetization, for example a desired spatially resolved flip angle distribution, to be employed as a target value within the target region. Crucial to the energy output during an MR examination is the voltage with which the radio-frequency pulses are transmitted, known as the RF transmitter voltage. It is determined in a separate MR scan, namely the AdjTra measurement (AdjTra being an abbreviation for adjust transmitter). To be more precise, during the AdjTra measurement the voltage is determined that is required in order to achieve an RF pulse that brings about a tilting of the resonantly excited atoms by a defined flip angle in particular tissue. This RF transmitter voltage varies considerably, both from patient to patient and very distinctly as a function of the position of the patient or of the table, on which the patient is positioned, within the RF resonator. Here a variation in the transmitter voltage by a factor of 1.5 is common when the position of the patient is changed by a few centimeters in the Z direction.

The SAR load can also be reduced by slowing the measurement. Thus the SAR is the limiting factor for a short measurement time in many clinical protocols. For this reason MR protocols are frequently created such that the permitted SAR limit values are just complied with. The result is that for patients with a high specific absorption or patients who because of their constitution can only tolerate a lower load, the SAR limit values are clearly exceeded in particular positions.

To prevent this, an SAR forecast is made by a so-called SAR solver after pre-setting the measurement, initially on the basis of adjustment parameters. If the load values determined in this way lie above the limit value, the measurement is aborted even before the start and the protocol parameters are changed. For example, the repetition time TR of the pulse sequences is extended or the number of slices recorded is reduced. In the latter case either a smaller FoV (field of view) is accepted or the resolution of the recorded image is reduced. As a further measure, a reduction can also conventionally be made in the flip angle, which is achieved by reducing the transmitter voltage. The flip angle can also be adjusted automatically. For example, before the measurement the user selects a minimum flip angle, up to which the flip angle can be automatically adjusted. If on the basis of the SAR forecast, it is now found necessary to reduce the flip angle, the system automatically changes the transmitter voltage, providing the corresponding flip angle is less than the predetermined minimum value. However, the result of these techniques is that parameters of the protocol are changed such that the result of the measurement no longer satisfies the original requirements in terms of image quality and patient coverage. Furthermore, because the measurement procedure is aborted at the start and the settings of the measurement protocol are changed, the examination sequence is interrupted and the time the patient spends in the MR scanner is increased.

SUMMARY OF THE INVENTION

An object of the invention is to provide a method with which the load on the patient during the MR image recording is limited and nevertheless the recording time, the image quality, and the image pick-up region FoV satisfy the clinical requirements.

A basis if the invention is that the position of the patient, and thus of the patient table, has a strong influence on the transmitter voltage required, and thus on the SAR. This circumstance is inventively taken into consideration such that initially an SAR load for an examination object with a calculated pulse sequence is determined at least for a first table position. Then the table position is adjusted, taking into consideration the SAR load at the first table position.

By adjusting the table position, an SAR reduction is achieved. In contrast to the conventional approaches, however, the image quality is maintained, because no action is taken that impairs the image quality, such as, for example, a reduction in the flip angle or a reduction in the number of slices recorded. The performance of the measurement with the pulse sequence required by the user is thus guaranteed. Changing the pulse sequence in order not to exceed the SAR limit load is avoided. Furthermore, safety hardware (watchdog) stops the actual measurement from being interrupted, or at least makes this less likely. Finally, time is no longer lost when the repetition time of the pulse sequence is increased, as is conventionally the case.

The inventive computer has a determination processor that is designed to determine an SAR load for an examination object with a calculated pulse sequence at least for a first table position. Furthermore the computer has an adjustment processor designed to adjust the table position, taking into consideration the SAR load at the first table position.

The individual processors of the inventive computer can be components of different computers, such as a measurement control computer, a receiving unit or an evaluation unit.

Thus the term "computer" as used herein encompasses processing capacity distributed among several different physical locations.

The inventive magnetic resonance system includes the inventive computer.

Many of the above-mentioned components of the inventive computer, in particular the determination receiver and the adjustment receiver, can be implemented partially or wholly in the form of software modules. This is advantageous, since by installing software it is also possible to retrofit existing hardware devices to perform the inventive method. The invention hence also encompasses a non-transitory, computer-readable data storage medium that can be loaded directly or distributively into one or more processors of a programmable computer of a magnetic resonance system. The storage medium is encoded with program code that causes all steps of the inventive method to be executed by the programmable control computer. In this case the control computer can also have distributed units, for example a measurement control unit, a reconstruction unit, an evaluation unit, etc. A computer terminal can also be regarded as a control console, with which a user can make inputs to control a magnetic resonance system.

In a preferred embodiment of the inventive method it is determined whether an image recording with the pulse sequence exceeds an SAR limit value for the examination object at a first table position currently provided by the pulse sequence. If the SAR limit value is exceeded for the first table position, the table position of the object to be examined is adjusted, so that the SAR limit value is complied with. The adjustment of the table position is implemented by moving to another position differing from the first position.

In a variant of the inventive method, the adjustment of the table position is achieved simply by sending a message to the user that a change should be made to the table position of the object to be examined. The actual adjustment of the table position is in this variant performed by the user himself. For example the user finds the right table position by testing. This variant is particularly cost-effective and allows the user the maximum freedom to define the table position.

In another embodiment, automatic AdjTra measurements are performed for various table positions during the step of adjusting the table position. In the following, AdjTra measurements mean the determination of what RF transmitter voltage is required in order to achieve an RF pulse with a defined flip angle in a tissue. Then the optimum table position with the smallest AdjTra value, i.e. the lowest RF transmitter voltage, is determined. Finally the optimum table position is displayed. Alternatively a range of table positions can also be displayed, at which the SAR limit value is likely to be complied with.

Before AdjTra measurements are automatically performed, it is possible for example to define a range for the various table positions, in which the table is moved and the AdjTra measurements are performed. For example, a range for the table positions from −5 cm to +5 cm can be defined, with the first table position lying at 0 cm. The table position at 0 cm may for example be the position at which the range to be mapped lies in the center of the field of view FoV.

Preferably, before the AdjTra measurements are performed automatically, an interval between the various table positions can be defined, at which the AdjTra measurements are performed. For example, an interval between the individual table positions of 1 cm can be defined. If for example a range from −5 cm to +5 cm is defined for moving the table positions, table positions for the values −5 cm, −4 cm, −3 cm, −2 cm, −1 cm, +1 cm, +2 cm, +3 cm, +4 cm, +5 cm are initiated.

In another embodiment of the method the user can select the interval or the length of the travel path between the individual table positions.

In a preferred variant, not only is a predefined range containing AdjTra measurements run through automatically, but also the determination of the table position with the smallest AdjTra value and the setting of the optimum table position are automated. In this variant the user is freed from having to make adjustments.

In another embodiment of the inventive method continuously changed table positions can be determined in advance in conjunction with a TimCT (Total imaging matrix Continuous Table) adjustment for a measurement curve of AdjTra values. The table position is then adjusted on the basis of the previously determined measurement curve of the AdjTra values. For example, extremes of the measurement curve are automatically determined and an optimum table position is defined. Alternatively, the definition of the optimum table position can also be performed by the user himself, but can likewise be performed on the basis of the data determined from the TimCT adjustment. In this variant the measurement data already present thanks to the TimCT adjustment can be used to determine suitable table positions. In the TimCT adjustment the table positions are run through continuously. In this case AdjTra values for all table positions are recorded continuously. The adjustment measurements are performed during the run-through (e.g. AdjTra is measured while the table is moving). At a constant speed the measurement value of a particular position (typically of the mean position) is assigned on conclusion of such a measurement lasting approx. 3 s. This of course only results in a mean value for the path traversed in the 3 s (typically 1-3 cm).

BRIEF DESCRIPTION OF THE DRAWINGS

FIG. 1 a schematic illustration of a magnetic resonance system according to one exemplary embodiment of the invention.

FIG. 2 is a flowchart of the method according to one exemplary embodiment of the invention FIG. 3 is a flowchart of the method according to an alternative exemplary embodiment of the invention.

DESCRIPTION OF THE PREFERRED EMBODIMENTS

FIG. 1 is a basic schematic illustration of an inventively designed magnetic resonance system 1. It includes the actual magnetic resonance scanner 2 with an examination space 8 or patient tunnel 8 located therein. A couch or patient table 7 can be introduced into this patient tunnel 8, so that a patient O or test person lying thereon can be positioned during an examination at a particular position inside the magnetic resonance scanner 2 relative to the magnetic system and radio-frequency system arranged therein or else during a measurement can be moved between different positions.

Fundamental components of the magnetic resonance scanner 2 are a basic field magnet 3, a gradient system 4 with magnetic field gradient coils for generating magnetic field gradients in the x, y and z directions, and a whole-body radio-frequency coil 5. The magnetic field gradient coils in the x, y and z directions can be controlled independently of one another, so that by means of a predefined combination gradients can be created in any logical spatial directions (for example in the slice selection direction, in the phase-encoding direction or in the readout direction), these directions generally depending on the slice orientation selected. Likewise the logical spatial directions can also match the x, y and z directions, for example the slice selection direction in the z direction, the phase-encoding direction in the y direction and the readout direction in the x direction. Magnetic resonance signals induced in the examination object O can be received by way of the whole-body coil 5, with which the radio-frequency signals for inducing the magnetic resonance signals are generally also transmitted. Normally however these signals are received using a local coil arrangement 6 with for example local coils (only one of which is illustrated here) being placed on or under the patient O. All these components are known in principle to the person skilled in the art and hence are only schematically illustrated in FIG. 1.

The components of the magnetic resonance scanner 2 are controlled by a control computer 10. This control computer can be composed of multiple individual computers or processors, if appropriate, spatially separated and interconnected via suitable cables or the like. This control computer 10 is connected via a terminal interface 17 to a terminal 30, via which an operator can control the entire system 1. In the present case, this terminal 30 is embodied as a computer console with a keyboard, one or more monitors and further input devices such as for example a mouse or similar, so that a graphical user interface is available to the operator.

The control computer 10 has, among other things, a gradient control unit 11, which in turn can be formed by several subcomponents. Via this gradient control unit 11, the individual gradient coils are connected in accordance with a gradient pulse sequence GS containing control signals. As described above, these are gradient coil pulses which during a measurement are set (output) at precisely predefined temporal positions with a precisely predefined time characteristic. The control computer 10 additionally has a radio-frequency transmitter unit 12, in order to feed radio-frequency pulses into the whole-body radio-frequency coil 5 in each case in accordance with a predefined radio-frequency pulse sequence RFS of the pulse sequence. The radio-frequency pulse sequence RFS includes, for example, excitation and refocusing pulses. The magnetic resonance signals are then received as raw data RD with the local coil arrangement 6, and the raw signal data RD received thereby are read out by an RF receiving unit 13. The raw data RD are used to reconstruct image data BD in a known manner, in an image reconstruction computer 14.

Alternatively a radio-frequency pulse sequence can be transmitted via the local coil arrangement, and/or the magnetic resonance signals can be received by the whole-body radio-frequency coil (not shown), depending on the current wiring of the whole-body radio-frequency coil 5 and of the coil arrangements 6 with the radio-frequency transmitter unit 12 or RF receiving unit 13.

Via a further interface 18, control commands are sent to other components of the magnetic resonance scanner 2, e.g. the couch 7 or the basic field magnet 3, or measured values or other information are received.

The gradient control unit 11, the RF transmitter unit 12 and the RF receiving unit 13 are each controlled in a coordinated manner by a measurement control unit 15. Using corresponding commands this ensures that the desired gradient pulse sequences GS and radio-frequency pulse sequences RFS are transmitted. In addition it must be ensured that at the correct time the magnetic resonance signals at the local coils of the local coil arrangement 6 are read and further processed by the RF receiving unit 13. Likewise the measurement control unit 15 controls the further interface 18. The measurement control unit 15 can, for example, be a processor or several interoperating processors.

The basic operation of such a magnetic resonance measurement and the cited control components are known to those skilled in the art, and thus need not be further discussed here in detail. In addition, such a magnetic resonance scanner 2 and the associated control device can also have a number of other components, which likewise need not be explained in detail herein. It should be noted that the magnetic resonance scanner 2 can be structured differently, for example with a laterally open patient space, or as a smaller scanner in which only part of a body can be positioned.

To start a measurement, an operator can normally select, via the terminal 30, a control protocol P provided for this measurement from a memory 16, in which a number of control protocols P are stored for different measurements. In addition, the operator can also retrieve control protocols, for example from a manufacturer of the magnetic resonance system, via a network NW, and then modify and use these as appropriate.

When a pulse sequence S is being processed it is initially sent from the measurement control unit 15 to a device 24 (shown in FIG. 1 by a broken line) for controlling a table position of an examination table 7 of the magnetic resonance system 1 during a magnetic resonance measurement in the measurement control unit 15. Thereafter, the pulse sequence S is supplied, via a pulse transmission arrangement 19 of the measurement control unit 15, which ultimately transmits the radio-frequency pulse sequence RS to the RF transmitter unit 12 and transmits the gradient pulse sequence GS to the gradient control unit 11. The device 24 has a determination unit 20 (shown in FIG. 1 by a broken line), which has a test unit 21 which performs test measurements, known as AdjTra measurements, on the basis of this pulse sequence S, to determine what transmitter voltage $U_T$ is necessary to achieve an RF pulse with a particular flip angle in a tissue.

The determination unit 20 further has a solver 22. If the transmitter voltage $U_T$ used for the pulse sequence is defined, this pulse sequence S is transmitted to the solver 22, which based on a model calculation determines whether SAR limit values for the object (O) to be examined are being complied with during an image recording with the pulse sequence S with the defined transmitter voltage $U_T$. If the SAR limit value is being complied with, the pulse sequence S with the transmitter voltage $U_T$ can be transmitted by the pulse transmission arrangement 19. The measurement control unit 15 additionally comprises a table position control unit 23. The table position control unit 23 moves the patient table as required, i.e. if the solver 22 has established that the SAR limit value is not being complied with, by a predefined distance. At the new table position the transmitter voltage $U_T$ can again be defined by the test unit 21 of the determination unit 20, a test can be performed by the solver 22 of the determination unit 20 to see whether SAR limit values are being complied with, and if necessary the table position can be changed by the table position control unit 23.

FIG. 2 illustrates the method 200 for controlling a table position of an examination table of a magnetic resonance system during a magnetic resonance measurement according to a first exemplary embodiment of the invention. In step 2.I a pulse sequence S is initially defined for a subsequent image recording of an examination object. As mentioned, this pulse sequence S can be selected from a memory 16 (see FIG. 1) based on a control protocol P provided for this measurement, in which memory 16 a number of control protocols P are stored for different measurements. Alternatively the pulse sequence S can be generated via a network on the basis of a control protocol which for example is retrieved from a manufacturer of the magnetic resonance system and then modified if appropriate. So-called AdjTra measurements are performed with the pulse sequence S in step 2.II. In this case it is determined for a first table position what transmitter voltage $U_{Tmin}$ is necessary to achieve an RF pulse with a particular flip angle in a tissue to be examined. Based on these measurements, the transmitter voltage $U_T$ with which the generated pulse sequence S is to be output during the image recording is defined in step 2.III. In step 2.IV a calculation is performed as to whether an image recording of an examination object can be implemented with the given adjustment parameters, i.e. with the given pulse sequence S with the defined transmitter voltage $U_T$ at the first table position, in compliance with an SAR limit value $\lim_{SAR}$. If the result is positive, which is indicated by "y" in FIG. 2, the actual measurement to record an examination object O can be started in step 2.V. Should the result of the calculations in step 2.IV be negative, i.e. the SAR limit value with the given pulse sequence with the defined transmitter voltage is not being complied with, which is indicated by "n" in FIG. 2, the position of the examination table is moved in step 2.VI. The system then returns to step 2.II and the method is repeated, until in step 2.IV the SAR limit value is being complied with. In this case the actual measurement to record an examination object O can be started.

FIG. 3 illustrates a method 300 for controlling a table position of an examination table of a magnetic resonance system during a magnetic resonance measurement according to an alternative exemplary embodiment of the invention. In step 3.I a pulse sequence S is likewise first defined, as in the method 200. However, in contrast to the method 200, in method step 3.II a TimCT adjustment measurement is performed. During the TimCT adjustment measurement AdjTra measurements are performed at continuously changed table positions. The measurement results achieved thereby regarding the minimum transmitter voltages $U_{Tmin}$ as a function of the table position z are illustrated in step 3.III as a measurement curve. In step 3.IV an evaluation of the determined measurement curve is performed, for example in respect of extreme values of the measurement curve K. In step 3.V a selection is made of a suitable table position z on the basis of the preceding evaluation in step 3.IV and the transmitter voltage $U_T(z)$ associated with this table position is selected for the pulse sequence which was defined for the image recording in step 3.I. In step 3.VI a calculation is performed as to whether an image recording of an examination object can be implemented with the given adjustment parameters, i.e. with the given pulse sequence S with the defined transmitter voltage $U_T$ at the selected table position, in compliance with an SAR limit value $\lim_{SAR}$. If the result is positive, which is indicated by "y" in FIG. 3, the actual measurement to record an examination object O can be started in step 3.VII. Should the result of the calculations in step 3.VI be negative, i.e. the SAR limit value $\lim_{SAR}$ with the given pulse sequence S with the transmitter voltage $U_T(z)$ at the selected table position z is not being complied with, which is indicated by "n" in FIG. 3, a conventional measurement to reduce the RF load of the examination object O is additionally taken in step 3.VIII. For example, the pulse sequence S is changed such that the repetition time TR is extended or the number of slices recorded is reduced. Alternatively a smaller flip angle can also be accepted. In other words, the transmitter voltage $U_T$ is reduced to below the minimum value of the transmitter voltage determined during the TimCT adjustment measurements. Then the system returns to step 3.VI. In step 3.VI a calculation is performed as to whether an image recording of an examination object can be implemented with the given adjustment parameters, i.e. with the given pulse sequence S with the defined transmitter voltage $U_T$ at the selected table position z, in compliance with an SAR limit value $\lim_{SAR}$. If the result is positive, which is indicated by "y" in FIG. 3, the actual measurement to record an examination object O can be started in step 3.VII. Otherwise the system continues with step 3.VIII, as has already been described.

In the method described for controlling a table position of an examination table of a magnetic resonance system during a magnetic resonance measurement an acceleration of the magnetic resonance measurement is achieved, while simultaneously maintaining the image quality and guaranteeing the safety of the patient.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling an initial table position of an examination table, adapted to receive an examination object thereon, in a magnetic resonance scanner, comprising:

from a control computer, operating the magnetic resonance scanner according to a calculated pulse sequence, that includes radiation of radio-frequency (RF) energy from an RF transmitter into an examination object on the examination table;

during said operation of said magnetic resonance scanner, determining, in said control computer, a specific absorption rate (SAR) load for the examination object, with said examination table in an initial table position by determining whether acquisition of magnetic resonance data according to the calculated pulse sequence exceeds an SAR limit value for said examination object with said table at said initial table position; and from said control computer, if said SAR limit value is exceeded at said initial table position, emitting a table position control signal that moves said examination table to a different position from said initial table position dependent on the determined SAR load, so as to adjust the initial table position of the examination object to cause said SAR limit value to be satisfied.

2. A method as claimed in claim 1 comprising adjusting said examination table from said initial table position by transmitting a message from said computer to a user interface of said computer that said initial table position should be changed.

3. A method as claimed in claim 1 comprising adjusting said initial table position by:
   automatically performing adjust transmitter (AdjTra) measurements, for said RF transmitter at different table positions of said examination table;
   in said control computer, determining an optimum table position that has a smallest AdjTra value; and
   displaying a designation of said optimum table position at a user interface in communication with said control computer.

4. A method as claimed in claim 3 comprising, in said control computer, defining a range for said different table positions before performing the AdjTra measurements.

5. A method as claimed in claim 4 comprising setting said range to be between −5 cm and +5 cm.

6. A method as claimed in claim 3 comprising setting an interval between respective different table positions, before performing said AdjTra measurements.

7. A method as claimed in claim 1 comprising adjusting said initial table position by:
   automatically proceeding through a predetermined range of table positions with adjust transmitter (AdjTra) measurements, for said RF transmitter;
   determining a table position having a lowest AdjTra value; and
   from said control computer, automatically setting said examination table to said table position having said lowest AdjTra value.

8. A method as claimed in claim 1 comprising determining a measurement curve of a plurality of adjust transmitter (AdjTra) values, for said RF transmitter for continuously changed table positions together with Total image matrix Continuous Table (TimCT) adjustment of said examination table, and adjusting said initial table position using said measurement curve.

9. A device for controlling an initial table position of an examination table, adapted to receive an examination object thereon, in a magnetic resonance scanner, comprising:
   a control computer configured to operate the magnetic resonance scanner according to a calculated pulse sequence, that includes radiation of radio-frequency energy into an examination object on the examination table;
   said control computer being configured to determine, during said operation of said magnetic resonance scanner, a specific absorption rate (SAR) load for the examination object, with said examination table in an initial table position; and
   said control computer being configured, if said SAR limit value is exceeded at said initial table position, to emit a table position control signal that moves said examination table to a different position from said initial table position dependent on the determined SAR load so as to adjust the initial table position of the examination object to cause said SAR limit value to be satisfied.

10. A magnetic resonance apparatus comprising:
    a magnetic resonance scanner comprising an examination table at an initial table position, said an examination table being adapted to receive an examination object thereon;
    a control computer configured to operate the magnetic resonance scanner according to a calculated pulse sequence, that includes radiation of radio-frequency energy into the examination object on the examination table;
    said control computer being configured to determine, during said operation of said magnetic resonance scanner, a specific absorption rate (SAR) load for the examination object, with said examination table in an initial table position by determining whether acquisition of magnetic resonance data according to the calculated pulse sequence exceeds an SAR limit value for said examination object with said table at said initial table position; and
    said control computer being configured, if said SAR limit value is exceeded at said initial table position, to emit a table position control signal that moves said examination table to a different position from said initial table position dependent on the determined SAR load, so as to the initial table position of the examination object to cause said SAR limit value to be satisfied.

11. A non-transitory, computer-readable data storage medium encoded with programming instructions, said storage medium being loaded into a control computer of a magnetic resonance apparatus that comprises a magnetic resonance scanner with an examination table that is movable within said magnetic resonance scanner, said examination table being adapted to receive an examination object thereon, and said programming instructions causing said control computer to:
    operate the magnetic resonance scanner according to a calculated pulse sequence, that includes radiation of radio-frequency energy into the examination object on the examination table;
    during said operation of said magnetic resonance scanner, determine a specific absorption rate (SAR) load for the examination object, with said examination table in an initial table position; and
    if said SAR limit value is exceeded at said initial table position, emit a table position control signal that moves said examination table to a different position from said initial table position dependent on the determined SAR load, so as to the initial table position of the examination object to cause said SAR limit value to be satisfied.

* * * * *